United States Patent [19]
Puretz

[11] Patent Number: 5,827,786
[45] Date of Patent: Oct. 27, 1998

[54] CHARGED PARTICLE DEPOSITION OF ELECTRICALLY INSULATING FILMS

[75] Inventor: Joseph Puretz, Beaverton, Oreg.

[73] Assignee: FEI Company, Hillsboro, Oreg.

[21] Appl. No.: 853,229

[22] Filed: Apr. 28, 1997

Related U.S. Application Data

[63] Continuation of Ser. No. 267,189, Jun. 28, 1994, abandoned.

[51] Int. Cl.$^6$ .................................................. H01L 21/316
[52] U.S. Cl. ........................... 438/789; 438/790; 427/526; 427/527; 427/529; 427/531; 250/492.21
[58] Field of Search .................................... 438/778, 787, 438/789, 790; 427/526, 527, 529, 531; 118/723 FI; 250/492.21

[56] References Cited

U.S. PATENT DOCUMENTS

| | | | |
|---|---|---|---|
| 4,845,054 | 7/1989 | Mitchener | 437/238 |
| 4,851,097 | 7/1989 | Hattori et al. | 204/192.33 |
| 4,874,460 | 10/1989 | Nakagawa et al. | 156/626 |
| 4,876,112 | 10/1989 | Kaito et al. | 427/38 |
| 4,930,439 | 6/1990 | Sato et al. | 118/723 |
| 4,950,498 | 8/1990 | Kaito | 427/38 |
| 4,976,843 | 12/1990 | Ward et al. | 204/298.36 |
| 5,083,033 | 1/1992 | Komano et al. | 250/492.2 |
| 5,148,024 | 9/1992 | Watanabe | 250/492.2 |
| 5,196,102 | 3/1993 | Kumar | 427/528 |
| 5,429,730 | 7/1995 | Nakamura et al. | 204/192.34 |

FOREIGN PATENT DOCUMENTS

| | | | |
|---|---|---|---|
| 0199585 | 10/1986 | European Pat. Off. | C23C 16/04 |
| 2-000963 | 1/1990 | Japan | G03F 1/08 |
| 04329639 | 11/1992 | Japan | H01L 21/316 |
| 07022405 | 1/1995 | Japan | H01L 21/31 |

OTHER PUBLICATIONS

Fujino, K., 'SiO$_2$ Dep. By, A.P. and Low Temp. CVD Using Teos and Ozone', J. Electrochem. Soc., vol. 137, No. 9, Sep. 1990 (pp. 2883–2887).

Haruki Komano et al, "A rewiring technique for integrated circuit operation analysis using a silicon oxide film deposited by a focused ion beam", J. Vac. Sci. Technol. B, vol. 9, No. 5, Sep./Oct. 1991, pp. 2653, 2654, and 2655.

Primary Examiner—Charles L. Bowers, Jr.
Assistant Examiner—Matthew Whipple
Attorney, Agent, or Firm—Dellett and Walters

[57] ABSTRACT

In forming an insulating film upon a selected region of a sample, a gaseous vapor is directed over the selected region for depositing a compound of the gaseous vapor containing elements of the insulating film. A charged particle beam is directed toward the selected region in order to decompose the deposited compound and provide the desired insulating film.

18 Claims, 3 Drawing Sheets

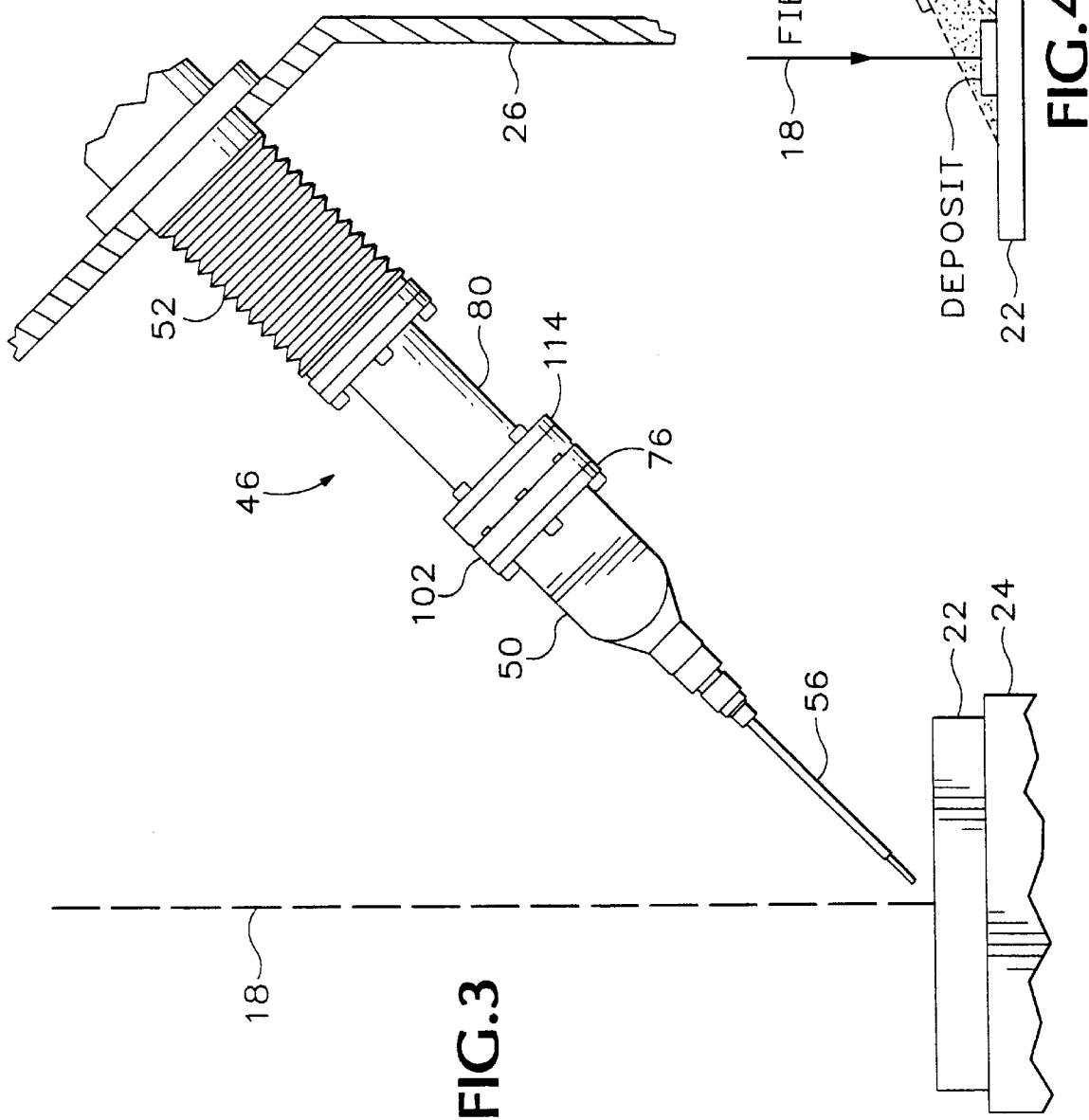

CHARGED PARTICLE DEPOSITION OF ELECTRICALLY INSULATING FILMS

This application is a continuation, of application Ser. No. 08/267,189, filed Jun. 28, 1994, now abandoned.

BACKGROUND OF THE INVENTION

The present invention relates to formation of an insulating film employing a charged particle beam and particularly to such a method for selectively depositing the insulating film upon a substrate comprising a semiconductor device.

An insulating film or the like can be deposited upon a substrate by exposing the substrate to a gaseous vapor and heating the substrate to an elevated temperature for decomposing the compound, leaving the insulating film. Focused ion beam systems can also be used in forming, shaping or altering microscopic structures in semiconductor devices or other solid materials. The focused ion beam is directed to a small point on a semiconductor device and then scanned, raster fashion, over a particular area where material is to be removed or deposited. As an ion impinges upon the semiconductor device surface, its momentum is transferred and can result in the removal of one or more surface atoms according to a process called sputtering. By selecting a raster pattern of a given overall shape, for example a horizontal raster pattern, a correspondingly shaped area of surface material can be removed or metal can be deposited if a particular metal containing compound is adhered to the semiconductor device.

A known method of depositing insulating material upon a specific area of a substrate includes directing a silicon ion beam toward a substrate simultaneously with the introduction of nitrogen or oxygen. The beam irradiated upon the substrate in the presence of the oxygen atmosphere forms a silicon oxide film. Likewise, if nitrogen is used in the place of oxygen, a silicon nitride film can be formed in accordance with the ion beam irradiation pattern. However, such method is subject to the drawback of damaging charge accumulation upon a semiconductor substrate and requires protective measures such as an electron shower for neutralizing the charging effect of the ion beam. In addition, the ion source must include the base element of the desired insulating film which may not correspond to the standard ion beam of the focusing ion beam system as used, for example, in producing conductive pathways on the same semiconductor substrate. A metal beam (e.g. gallium beam) used in deposition of conductors would not be thought to be successful in depositing an insulator inasmuch as the deposited product is generally conductive. However, it is desirable to be able to use the same beam and apparatus for depositing specific areas of both conductors and insulators.

SUMMARY OF THE INVENTION

In accordance with the present invention, an insulating film is formed upon a select region of a sample by a sequence of steps including providing a gaseous vapor of a compound having the elements of the desired insulating film. The gaseous vapor is directed over the select region of the sample onto which a metal ion beam is also directed with sufficient energy to obtain and deposit the film elements. A desirable vapor for accomplishing this result comprises alkoxysilane. Rather than being primarily conductive, the film is characterized by sufficient resistivity to act as an insulator.

It is accordingly an object of the present invention to provide an improved method for selectively depositing an insulating film upon a substrate.

It is another object of the present invention to provide selective deposition of an insulating film upon a substrate with a focused ion beam system employing a standard metal particle source.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

BRIEF DESCRIPTION OF THE DRAWINGS

FIG. 3 is a partial side view, broken away, of an apparatus for depositing an insulating film in accordance with the present invention; and FIG. 4 is a schematic side view of a particular portion of FIG. 1 type of system.

DETAILED DESCRIPTION

Figure 1:
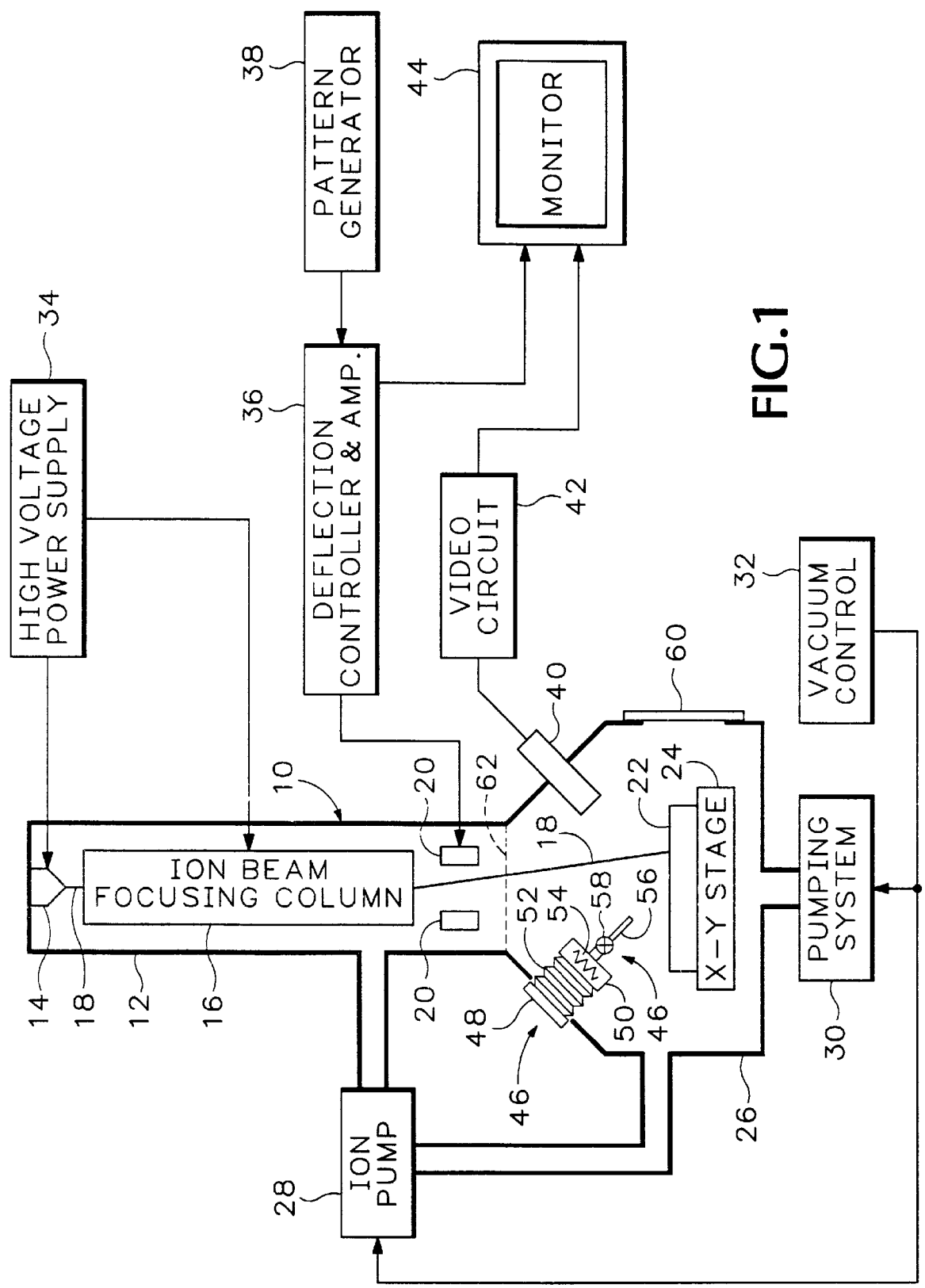
FIG. 1 is schematic representation of a focused ion beam system for depositing an insulating film in accordance with the present invention.

Referring to FIG. 1, illustrating a focused ion beam system for carrying out the present invention, an evacuated envelope 10 includes an upper neck portion 12 within which are located a liquid metal ion source 14 and a focusing column 16 which includes extractor electrode means and an electrostatic optical system. Ion beam 18 passes from source 14 through column 16 and between electrostatic deflection means schematically indicated at 20 toward sample 22, which suitably comprises a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32.

High voltage power supply 34 is connected to liquid metal ion source 14 as well as to appropriate electrodes in focusing column 16 for forming an approximately 25 keV ion beam 18 and directing the same downwardly. Deflection controller and amplifier 36, operated in accordance with a prescribed pattern such as a raster pattern provided by pattern generator 38, is coupled to deflection plates 20 whereby beam 18 may be controlled to trace out a corresponding pattern on the upper surface of sample 22.

The source 14 typically provides a metal ion beam of gallium (although other metallic ions can be used, for example indium or aluminum). The source is capable of being focused into a sub 0.1 micron width beam at sample 22 for either modifying the surface 22 by providing an insulating layer or a metal layer or for the purpose of imaging the surface 22. An electron multiplier 40 used for detecting secondary emission for imaging is connected to video circuit and amplifier 42, the latter supplying drive for video monitor 44 also receiving deflection signals from controller 36.

Source 46 is located inwardly of the side of chamber 26 by translation device 48 adapted for positioning said source via support means within bellows 52. The source 46 in particular comprises a reservoir 50. A heater 54, which may comprise a membrane type heater, may be utilized for raising the temperature of a compound within reservoir 50 to a temperature for providing a suitable vapor pressure as hereinafter more fully disclosed. A transfer tube or nozzle 56 comprising a capillary tube provided by a hypodermic needle extends from reservoir 50 and is connected thereto via control valve 58 adapted for releasing gaseous vapor. The nozzle is extended and translated in orthogonal directions substantially perpendicular to its axis employing translation apparatus 48, so that gaseous vapor can be aimed directly toward a region on the top surface of sample 22 where an insulating film is to be selectively deposited in accordance with the present invention.

A door 60 is opened for inserting sample 22 on stage 24 which may be heated, and also for servicing the reservoir 50. The door is interlocked so that it cannot be opened if the temperature in reservoir 50 is substantially above room temperature. A gate valve, schematically illustrated at 62, is closed before door 60 can be opened to seal off the ion source and focusing column apparatus. The base pressure within chamber 26 is suitably $1\times10^{-6}$ Torr. With the emission of the gaseous vapor from the vapor source 46, the chamber background pressure is suitably about $1\times10^{-5}$ Torr.

When reservoir 50 is raised to a desired temperature for vaporizing the compound within reservoir 50, valve 58 may be opened by withdrawing actuator rod 150 (FIG. 2) from outside the apparatus to open and regulate the position of valve plunger 40, while the nozzle 56 is directed towards the desired area of the sample. Bellows 52 accommodates movement of the nozzle assembly and reservoir relative to the sample without affecting the vacuum within chamber 26.

The vacuum control system along with the heater of gaseous vapor source 46 are operated to provide an appropriate vapor pressure condition for establishing a gaseous vapor flux in chamber as directed toward substrate 22 for depositing a precursor to an insulating layer. To establish a given gaseous flux, the reservoir is heated to a predetermined temperature.

The high voltage power supply provides the an appropriate acceleration voltage to electrodes in ion beam column 16 for energizing and focusing ion beam 18. When it strikes the sample having condensed gaseous vapor adhered thereupon, the ion beam has the energy for decomposing the deposited compound provided by the vapor deposition, and effecting deposition of insulating elements upon the sample.

Deflection controller and amplifier 36 causes the ion beam to be deflected in a desired pattern but wherein deflection of the ion beam is at a rate slow enough for establishing the film deposition upon sample 22. Considerations regarding deflection speed, loop time, etc. are well understood by those skilled in the art.

As hereinbefore mentioned, the vacuum system provides a vacuum of approximately $1\times10^{-6}$ Torr within chamber 26. With emission of gaseous vapor, the chamber background pressure is suitably about $1\times10^{-5}$ Torr. In an exemplary embodiment, the gaseous source 46 is heated to a temperature for providing a gaseous flux of roughly $10^{16}$–$10^{17}$ molecules per second per square centimeter via the capillary tube of the hypodermic needle, while the metal ion source and focusing column are suitably controlled for generating a flux of $10^{13}$–$10^{15}$ charged particles per second per square centimeter within the rastered area. It has been determined that such a ratio between gas flux and ion flux results in good deposition characteristics for the resulting film.

Figure 2:
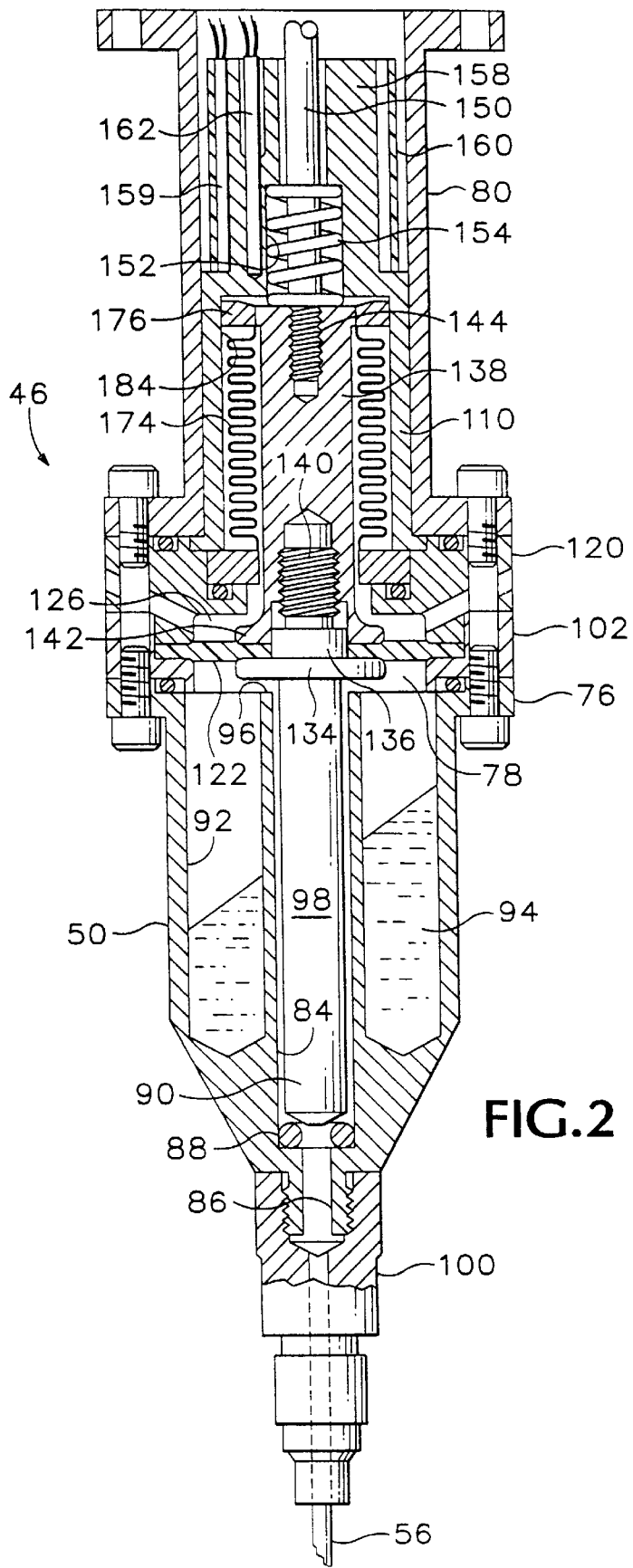
FIG. 2 is a partial cross-sectional view of a gas containment apparatus employed for injecting gas toward a substrate inside a reaction chamber in accordance with the present invention.

Co-pending patent application Ser. No. 08/123,292 filed by Jorgen Rasmussen entitled "Gas Injection System", assigned to the assignee of the present invention and hereby incorporated by reference, discloses apparatus for introducing and directing gaseous vapor toward sample 22. Referring to FIG. 2 of the present application, the vapor source comprises the reservoir 50 within which the compound to be vaporized is received, the lower end of the reservoir being provided with nozzle 56 in the form of hypodermic needle 56 providing a capillary tube having a small orifice for directing gas toward substrate 22. The hypodermic needle is attached to the threaded lower end of reservoir 50 by lock fitting 100. Upper flange 76 of reservoir 50 is secured to the periphery of sealing chamber 78, the latter depending ultimately from support tube 80. Support tube 80 is attached with screws to the lower end of bellows 52 as well as to positioning mechanism (not shown) within the bellows.

Reservoir 50 comprises a solid metal block elongated in a direction longitudinal of hypodermic needle 56 and provided with a central cylindrical passage 84 through which gas passes to the hypodermic needle. At its lower end, the longitudinal passage 84 narrows at 86, forming a shoulder for receiving O-ring valve seal 88 that cooperates with the tapered end of valve plunger 90 for regulating the flow of gas from passage 84 to nozzle 56. Plunger 90 is located at the lower end of actuator 98, the latter comprising a rod disposed coaxially within passage 84 and extending back through the passage. The outer diameter of actuator 98 is less than the inside diameter of passage 84 in order to form a channel for the delivery of gas.

Around central passage 84 in reservoir 50 are disposed a plurality of elongated cylindrical chambers 92 parallel to and in substantially surrounding relation with cylindrical passage 84, each chamber 92 comprising a longitudinal bore in the reservoir block 50 adapted to receive vaporizable material 94, such as liquid tetraethoxysilane (TEOS) as hereinafter further described. The upper end 96 of the reservoir is open to sealing chamber 78 wherein gas generated within the reservoir chamber is communicated to central passage 84.

Center rod extension 138 is threadably engaged at 140 by the end of actuator 98 whereby the center of membrane 122 is sealingly disposed between flange 134 and head 142 of center rod extension 138. Metal bellows 174 separates region 126 above membrane 122 from atmospheric pressure within support tube 80. The bellows 174 extends between rings 170 and 176, the former being locked between spacer ring member 120 and heat sink 110, while the latter is secured to the upper end of center rod extension 138 proximate the end of cavity 184 of sink 110 within which it slides as rod 150 is moved against the bias of spring 154 to open and close the valve comprising plunger 90 and O-ring 88.

Membrane 122 defines the upper wall of sealing chamber 78 and a lower wall of region 126 which is vented to chamber 26. Actuator 98 includes a radial flange 134 within chamber 78 for centrally engaging the membrane 122 which is peripherally held, while portion 136 of the actuator passes through a central aperture in membrane 122 and into a recess within the head end of center rod extension 138. Actuator 98 has a threaded portion 140 adapted to engage a mating thread in center rod extension 138.

The center rod extension 138 is provided with an upper internal threaded portion 144 mating with threads 14 at the lower end of actuating rod 150. Rod 150 is adapted to receive linear motion under the control of means within the positioning mechanism inside bellows 52 in FIG. 1 or therebeyond. Upper cavity 152 in heat sink 110 houses spring 154 acting between the heat sink and the upper end of center rod extension 138 so that the center rod extension and attached parts including actuator 98 are normally biased in a direction for closing plunger 90 against O-ring 88 to close off the flow of gas. However, when rod 150 is pulled upwardly (by means not shown) the valve is opened as center rod extension 138 and ring 176 slide within lower recess 184 in heat sink 110. The membrane 122 flexes with movement of the actuator.

Upper end portion 158 of heat sink 110 is of reduced cylindrical diameter and receives therearound a band heater 159 provided electrical current by means not shown, the heater being covered and held in place by shrink band 160. A thermistor 162 is embedded within portion 158 of the heat sink, and when electrical current is supplied to band heater 159, the thermistor 162 provides feedback to a control circuit for regulating the temperature of the heat sink at a desired elevated level for heating the reservoir 50 and the material therewithin. The heater and control therefor are conveniently located outside the vacuum region of chamber 26 eliminating electrical feedthroughs, but the heat generated is conducted via the vacuum wall to the reservoir.

The gas injection system 46 forms a housing providing an enclosure for generating and containing gas therewithin, the enclosure including chambers 92 and central passage 84 of reservoir 50 as well as sealing chamber 78 surrounded by the lower end of sealing member 102. The gas tight enclosure additionally comprises the flexible rubber membrane 122 clamped between sealing member 102 and spacer ring member 120 at the periphery thereof, while also being centrally clamped in sealing relation to actuator 98 between actuator flange 134 and the head 142 of center rod extension 138 as previously mentioned.

In accordance with an embodiment of the present invention, employing the focused ion beam apparatus as outlined above, reservoir 50 is advantageously provided with liquid tetraethoxysilane (TEOS) as the precursor compound for forming an insulating layer. Tetraethoxysilane, $Si(OC_2H_5)_4$,

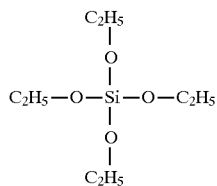

is characterized by a boiling point of 165° C. and provides a suitable vapor pressure at temperatures between room temperature and the boiling point temperature. A substrate, e.g. a semiconductor substrate for receiving the insulating film in a given selected area, is placed upon stage 24 as sample 22, stage 24 being heated (or cooled) as desired to adjust the adherence of the compound on the sample. The temperature of reservoir 50 is adjusted in order to establish a gas flux of approximately $10^{16}$–$10^{17}$ molecules per second per square centimeter through the capillary. The TEOS forms a layer adherent to the surface of sample 22. The metal ion beam 18 is directed by controller and amplifier 36 in response to the pattern generator 38 for deflecting the beam in a raster pattern corresponding to the selected area of sample 22 where an insulating film is to be deposited. When employing a gallium source for generating a gallium metal ion beam, an acceleration voltage of approximately 25 k electron volts is supplied for decomposing the adhered TEOS compound and depositing a silicon dioxide insulating film 23 upon the sample 22. Surprisingly, the film is characterized by a resistivity to be primarily insulating rather than conductive as might be expected with a metal beam.

In accordance with an alternative embodiment for depositing a silicon dioxide film upon a substrate, the compound selected for insertion within the reservoir 50 comprises tetrabutoxysilane, $Si(OC_4H_9)_4$,

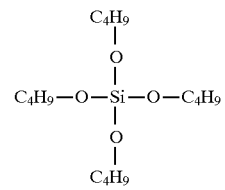

Tetrabutoxysilane has a boiling point of 115° C. and a flashpoint temperature of 174° C. which is higher than the flashpoint temperature of the tetraethoxysilane. Having a lower boiling point temperature, tetrabutoxysilane is more readily vaporized for providing gaseous vapor incident toward a substrate 22 and consequently heater 54 may be operated at a lower temperature. However, having a lower boiling temperature, the gaseous vapor does not as readily condense onto the substrate as with tetraethoxysilane. The temperature of the stage can be adjusted to provide proper adherence. Nonetheless, tetrabutoxysilane has a substantially higher flash-point temperature and thus poses reduced fire hazard.

Other compounds suitable for use as the gaseous vapor source include:

Tetramethoxysilane, $Si(OCH_3)_4$,

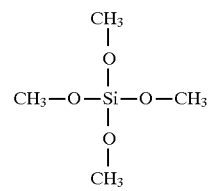

and tetrapropoxysilane, $Si(OC_3H_7)_4$,

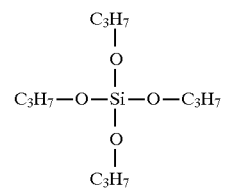

The gaseous vapor can in general be derived from members of the alkoxysilane family characterized by four alkyl or $C_nH_{2n+1}$ groups each bonded to an oxygen atom, with the four groups bonded to a silicon atom. A vapor pressure is provided for supplying a gaseous vapor flux (on the order of $10^{16}$–$10^{17}$ molecules per second per square centimeter) incident on the substrate to provide an adherent layer on the substrate which is subject to decomposition by the ion beam.

The insulating film actually can be deposited in two ways. The substrate can be heated to an elevated temperature sufficient for decomposing the condensed vapor thereon without the influence of a focused ion beam. The insulating film can be deposited over a broad area. For this purpose the stage is heated to a temperature for decomposing the compound. Alternatively, and in accordance with the present invention, the gaseous vapor is directed upon the substrate and adherently condenses thereon with the substrate at a lower temperature insufficient for decomposing the silane compound. The focused ion beam is selectively directed upon the substrate having the condensed compound adhered thereto for decomposing the compound and providing a silicon dioxide (or other silicon oxide) insulating film in a shape determined by the pattern followed by the focused beam.

Although examples in this application have discussed the use of an ion beam to bring about the decomposition of the silane compound and the deposition of an insulator, in many cases an electron beam of sufficient energy can be substituted for the ion beam.

While several embodiments of the present invention have been described, it will be apparent to those skilled in the art that many other changes and modifications may be made without departing from the invention in its broader aspects. The appended claims are therefore intended to cover all such changes and modifications as fall within the true spirit and scope of the invention.

I claim:

1. A method of forming an insulating film upon a select region of a sample comprising the steps of:

providing a gaseous vapor consists essentially of a compound including principal elements for the desired insulating film, wherein the desired insulating film is a silicon oxide film and said compound consists of a single compound selected from the group consisting of tetrabutoxysilane, $Si(OC_4H_9)_4$, tetramethoxysilane, $Si(OCH_3)_4$ and tetrapropoxysilane, $Si(OC_3H_7)_4$;

directing said gaseous vapor over the select region of the sample for depositing said compound thereon; and directing a charged particle beam toward the select region of the sample for decomposing said compound to provide an insulating film comprising said elements upon said select region of the sample and wherein said charged particle beam is comprised of a noninsulating compound that has properties of a contaminant in the insulating film.

2. The method according to claim 1 wherein said beam is a metal ion beam.

3. The method according to claim 2 wherein said metal ion beam is a gallium ion beam.

4. The method according to claim 1 wherein said compound consists of tetrabutoxysilane, $Si(OC_4H_9)_4$.

5. The method according to claim 1 wherein said compound consist of tetramethoxysilane, $Si(OCH_3)_4$.

6. The method according to claim 1 wherein said compound consist of tetrapropoxysilane, $Si(OC_3H_7)_4$.

7. The method according to claim 1 wherein said step of providing said gaseous vapor includes heating said compound.

8. The method according to claim 1 wherein said step of providing said gaseous vapor includes obtaining said gaseous vapor from a liquid form of said compound.

9. The method according to claim 1 further comprising the step of establishing said sample at a deposition temperature.

10. A method of forming a dielectric film upon a substrate comprising the steps of:

disposing said substrate within an enclosed chamber;

supplying a gaseous vapor consisting of a single gaseous compound, the single gaseous compound being an alkoxysilane, selected from the group consisting of tetrabutoxysilane, tetramethoxysilane and tetrapropoxysilane, within said chamber with a flow thereof passing over said substrate;

generating a focused metal ion beam; and directing said metal ion beam upon a select region of said substrate, wherein said metal ion beam causes formation of a dielectric film upon said substrate within said select region, said dielectric film being made up primarily of silicon oxide as provided by the alkoxysilane of the gaseous vapor.

11. A method according to claim 10 wherein the substrate comprises a semiconductor device.

12. A method according to claim 10 wherein the metal ion beam is obtained from a gallium ion source.

13. A method according to claim 10 wherein the step of supplying said gaseous vapor includes obtaining said gaseous vapor from a containment source and directing said gaseous vapor through an orifice of the containment source toward said substrate.

14. The method according to claim 10 wherein said gaseous vapor consists of tetrabutoxysilane.

15. The method according to claim 10 wherein said gaseous vapor consists of tetramethoxysilane.

16. The method according to claim 10 wherein said gaseous vapor consists of tetrapropoxysilane.

17. The method according to claim 10 wherein the step of supplying the gaseous vapor includes heating a reservoir containing said alkoxysilane.

18. The method according to claim 10 further comprising a step of establishing said substrate at a deposition temperature for desired adherence.

* * * * *